United States Patent [19]
Shou et al.

[11] Patent Number: 5,381,375
[45] Date of Patent: Jan. 10, 1995

[54] MEMORY DEVICE

[75] Inventors: Guoliang Shou; Weikang Yang; Sunao Takatori; Makoto Yamamoto, all of Tokyo, Japan

[73] Assignee: Yozan Inc., Tokyo, Japan

[21] Appl. No.: 137,736

[22] Filed: Oct. 19, 1993

[30] Foreign Application Priority Data

Oct. 21, 1992 [JP] Japan .................. 4-308267

[51] Int. Cl.[6] .................. G11C 16/00; G11C 7/00
[52] U.S. Cl. .................. 365/204; 365/149; 365/185; 365/194; 365/195
[58] Field of Search .............. 365/194, 185, 195, 204, 365/189.09, 184, 148, 149, 102

[56] References Cited

U.S. PATENT DOCUMENTS 5,161,123  11/1992  Mochizuki .................. 365/204

OTHER PUBLICATIONS

Dorf, "The Electrical Engineering Handbook", CRC Press, 1993, pp. 1927–1937.

Primary Examiner—D. Hyun Yoo
Attorney, Agent, or Firm—Cushman, Darby & Cushman

[57] ABSTRACT

A memory device capable of storing a time element. The memory device includes: i) a threshold element outputting a voltage output when a gate voltage reaches a threshold voltage; ii) two inputs capacitive coupling connected to a gate of the threshold element; iii) the first RC circuit connected to the first input of the two inputs capacitive coupling; iv) the first RC circuit charging capacitance by the constant number in the predetermined time through the predetermined reference voltage inputs; v) the charging voltage of the capacitance inputted into the two inputs capacitive coupling, and vi) an output of the threshold element connected to a memory element whose parameter is time.

3 Claims, 1 Drawing Sheet

MEMORY DEVICE

BACKGROUND OF THE INVENTION

1. Field of the Invention

The present invention relates to a memory device.

2. Description of the Related Art

Conventionally, a memory device stores digital information as a voltage level. However, more recent memory devices have been required to manage multi-information because there is an argument that digital computers are limited in their processing ability. Inventors have suggested a way of mapping a voltage signal into time space by using an exponential function. This process enables multiplication and division calculations in the voltage space to be performed as addition and subtraction calculations in the time space.

In order to realize such an idea as a circuit, it is necessary to store times elements. However, such a memory means heretofore did not exist.

SUMMARY OF THE INVENTION

The present invention solves the above-identified problems with conventional memory devices and provides a memory device that is capable of storing time elements.

A memory device of the present invention sets an off-set corresponding to the time constant of an RC circuit by using an input voltage, drives a threshold element using charging voltage from a capacitance in the RC circuit and provides an output of the threshold elements to a memory element whose parameter is time.

DETAILED DESCRIPTION OF THE PRESENTLY PREFERRED EMBODIMENTS OF THE INVENTION

Hereinafter, an embodiment illustrating the principles of the present invention is described below with reference to the attached drawings.

Figure 1:
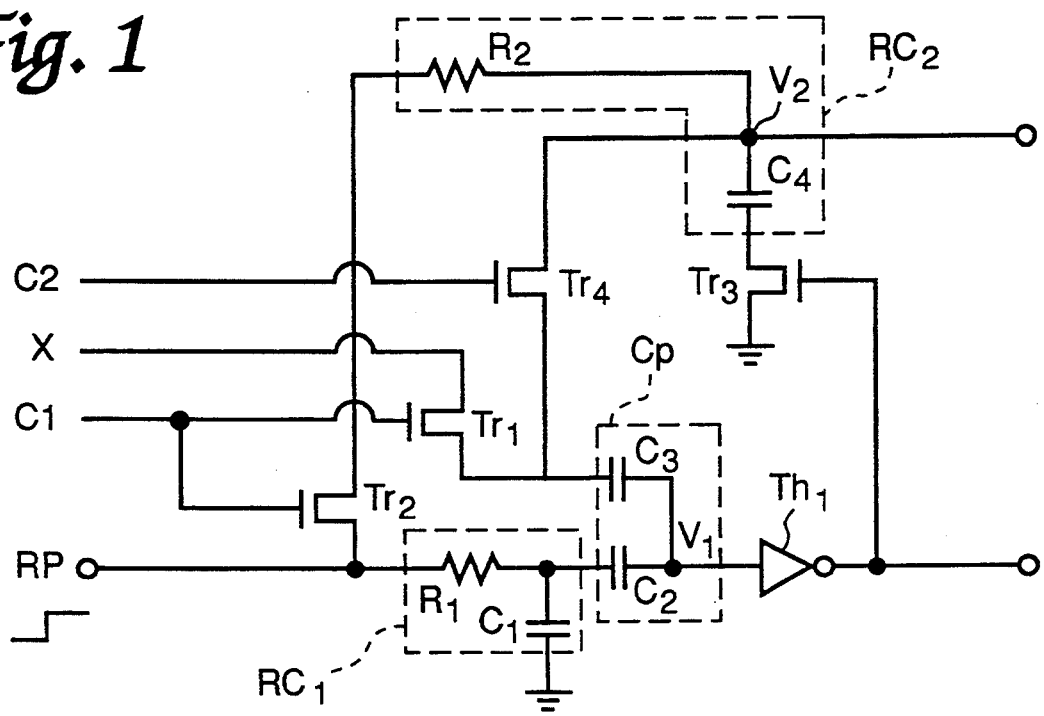
FIG. 1 is a circuit diagram showing an embodiment of a memory cell in a memory device according to the principles of the present invention.

FIG. 1 shows a memory device that has a threshold element $Th_1$ which outputs an output voltage when a gate voltage reaches a threshold voltage. Threshold element $Th_1$ has a gate connected to two inputs of a capacitive coupling circuit $C_p$. The output of circuit $C_p$ is connected to the gate of $Th_1$, and one input (it is shown by the first input of $C_p$) is connected to an RC circuit (shown by $RC_1$). $Th_1$, $C_p$ and $RC_1$ define a timer $T_1$.

A reference voltage RP is inputted to a resistor $R_1$ in $RC_1$. Capacitance $C_1$ has one terminal connected to the first input of $C_p$ and the other terminal is connected to ground. The other input of $C_p$ (it is shown by the second input) is connected to an input voltage X through a switch means $Tr_1$.

If a capacitance of $C_p$ is $C_2$ and $C_3$, and the output voltage is $V_1$, then we can obtain the formula below.

$$V_1 = [C_3 X + C_2 \{1 - exp(-t/(R_1 C_1))\}]/(C_2 + C_3)$$

According to this formula, $Th_1$ generates an output voltage $V_m$ (a source voltage) when $V_1$ reaches the threshold voltage $Vt_1$ of $Th_1$. RP reaches $V_m$ in steps, RC starts to charge, and $V_1$ is equal to $Vt_1$ in a time tx corresponding to X.

As shown by a following formula, $$Vt_1 = [C_3 X + C_2 \{1 - exp(-tx/(R_1 C_1))\}]/(C_2 + C_3),$$

at the same time, time tx corresponding to X is obtained.

If it is possible to keep the time tx in any way, it is the same as keeping $Vt_1$.

In order to keep tx, reference voltage RP is connected to the second RC circuit (it is shown by $RC_2$) through a switch means $Tr_2$. $RC_2$ has a resistance $R_2$ connected to RP, one terminal of a capacitance $C_4$ is connected to a single terminal of $R_2$, and the other terminal of $C_4$ is through a switch means $Tr_3$. $Tr_3$ also connects the output of $Th_1$ to ground, and charging of $C_4$ is stopped after opening $Tr_3$ at the time of tx. $RC_1$ and $RC_2$ are charged by RP at the same time so that a charging voltage of $C_4$ has a value corresponding to tx, because charging of $RC_2$ ends at the time of tx.

If the charging voltage is $V_2$, then $$V_2 = V_m \{1 - exp\{tx/(R_2 C_4)\}.$$

That is, the value of $V_2$ can be used to read the value of X. Here, the time constant of the RC circuit is comparatively accurately set, so the accuracy of tx is very high.

It is possible to convert X into tx' corresponding to $V_2$, if $V_2$ is connected to the second input of CP through a switch means $Tr_4$, $Tr_1$ is shut and $Tr_4$ is closed.

In this situation, the voltage to which $C_4$ is charged corresponds to tx', which is $$Vt_1 = [C_3 V_2 + C_2 \{1 - exp(-tx'/(R_1 C_1)\}].$$

Switch means Tr1 and Tr2 are controlled by signal C1, and a switch means Tr4 is controlled by control signal C2.

Figure 2:
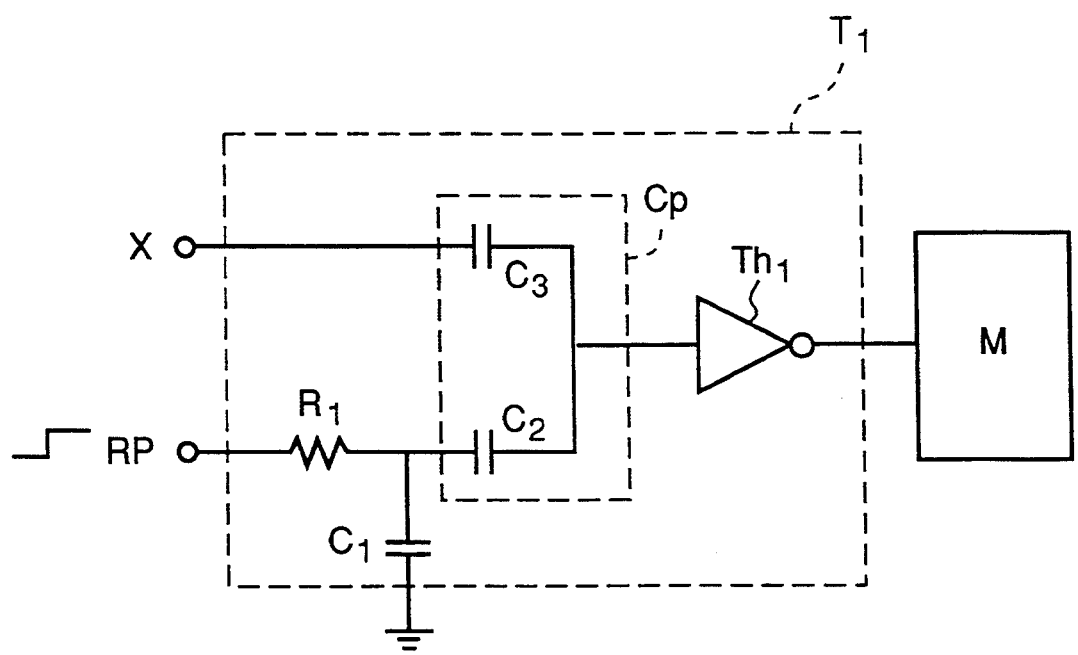
FIG. 2 is a diagram showing a second embodiment of a memory cell according to the principles of the present invention.

FIG. 2 shows another embodiment of the present invention. In this embodiment, an EPROM (shown by M) is used as a memory element instead of $RC_2$. Generally, the EPROM operates writing in a simple portion with the length of the charging pulse. Therefore, it is possible to detect tx by reading the voltage level.

As mentioned above, the present invention provides a memory device that can store a time element because a memory device relating to the present invention sets an off-set corresponding to the time constant of an RC circuit by using an input voltage, drives a threshold element by using a charging voltage of a capacitance in the RC circuit and inputs an output of the threshold elements into the memory elements whose parameter is time.

What is claimed is:

1. A memory device comprising:
   i) a threshold element having a gate and an output, said threshold element outputting a voltage at said output when a voltage at said gate reaches a threshold voltage;
   ii) a capacitive coupling circuit including a first capacitance and a second capacitance and having a first input, a second input, and an output, said output of said capacitive coupling circuit being connected to said gate of said threshold element and said second input receiving an input voltage;

iii) a first RC circuit connected to said first input of said capacitive coupling circuit, said first RC circuit including a third capacitance therein, said first RC circuit receiving a predetermined reference voltage and being connected so that said third capacitance is charged over a predetermined period of time, the voltage of said third capacitance being output to said first input of said capacitive coupling circuit; and iv) a memory element whose parameter is time, wherein an input of said memory element is connected to said output of said threshold element.

2. A memory device as defined in claim 1, wherein said memory element is an EPROM.

3. A memory device as defined in claim 1, wherein said memory element comprises:
 i) a first switch means actuated by said output voltage of said threshold element;
 ii) a second RC circuit charged by said predetermined reference voltage; and
 iii) a second switching means for switching a voltage in said second RC circuit to said second input of said capacitive coupling circuit, wherein said second RC circuit finishes charging a fourth capacitance in said second. RC circuit when said threshold element outputs said output voltage.

* * * * *